United States Patent [19]
Cochran

[11] 4,162,446
[45] Jul. 24, 1979

[54] TRANSCEIVER WITH ONLY ONE REFERENCE FREQUENCY

[75] Inventor: Michael J. Cochran, Richardson, Tex.

[73] Assignee: Texas Instruments Incorporated, Dallas, Tex.

[21] Appl. No.: 791,450

[22] Filed: Apr. 27, 1977

[51] Int. Cl.² ............................................. H04B 1/40
[52] U.S. Cl. ...................................... 325/15; 325/25; 333/165
[58] Field of Search ....................... 325/15, 20, 21, 25, 325/17; 328/167; 333/70 T

[56] References Cited

U.S. PATENT DOCUMENTS

| | | | |
|---|---|---|---|
| 3,588,701 | 6/1971 | Kahn | 325/15 |
| 3,641,434 | 2/1972 | Yates | 325/25 |
| 3,835,384 | 9/1974 | Liff | 325/25 |
| 3,983,484 | 9/1976 | Hodama | 325/20 |
| 4,027,242 | 5/1977 | Yamanaka | 325/25 |

*Primary Examiner*—Robert L. Griffin
*Assistant Examiner*—Michael A. Masinick
*Attorney, Agent, or Firm*—Stephen S. Sadacca; James T. Comfort; Melvin Sharp

[57] ABSTRACT

A transceiver includes a first mixer and a detector in the receive signal path and a second mixer and modulator in the transmit signal path, all of which are coupled to and are operated by programmable counter circuits clocked by a single reference frequency generator. In one embodiment, a charge transfer device filter, which is connectable to both the receive and transmit signal paths by a switch and which has an adjustable bandwidth and center frequency, is also coupled to and operated by a programmable counter circuit which is clocked by the single reference frequency generator.

10 Claims, 20 Drawing Figures

MIXER 200

MIXER 300

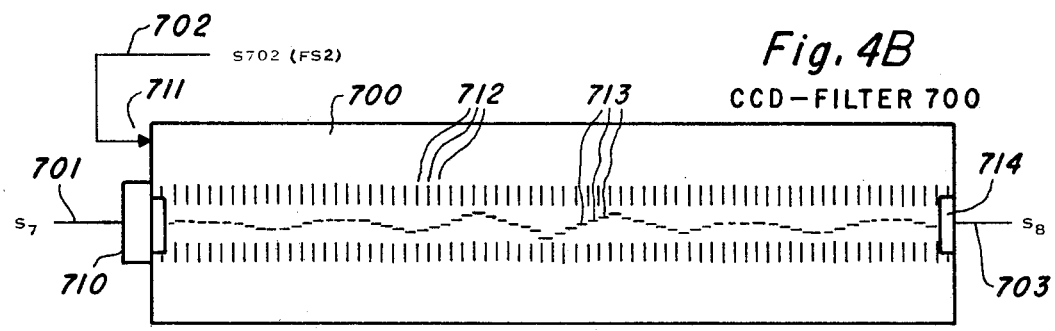
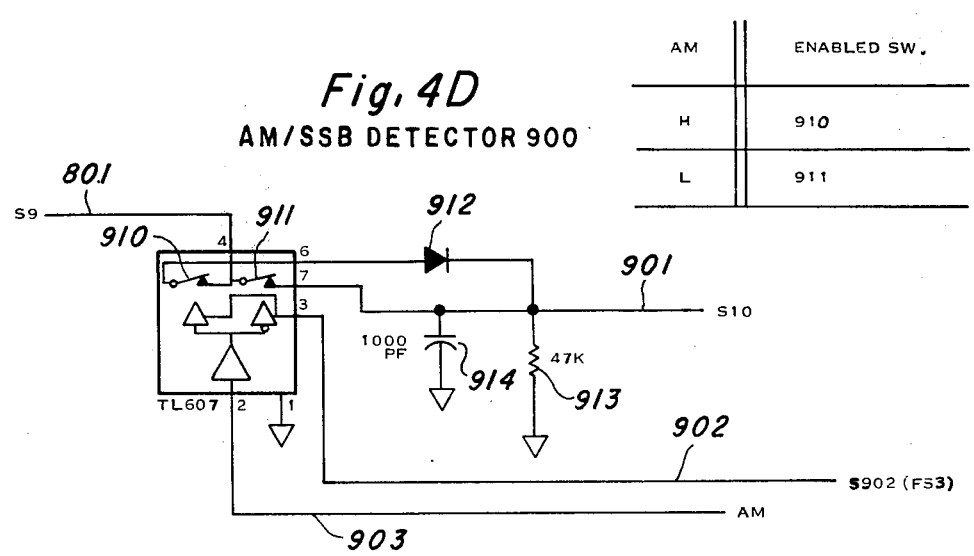

CLOCKING MODULE 3000

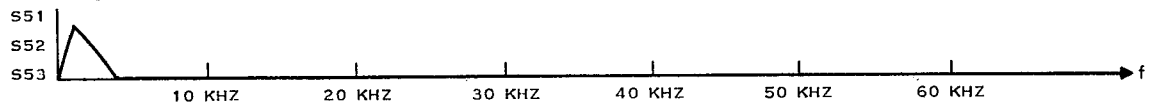
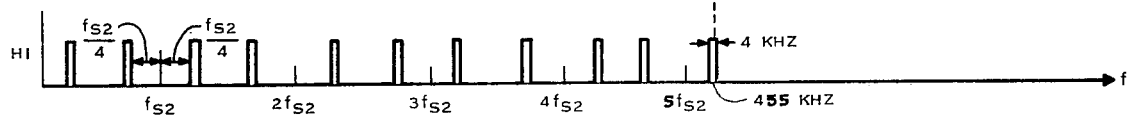
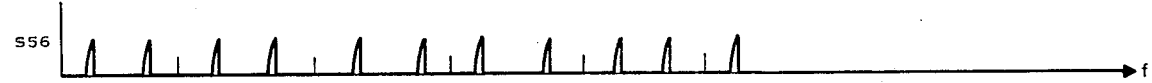
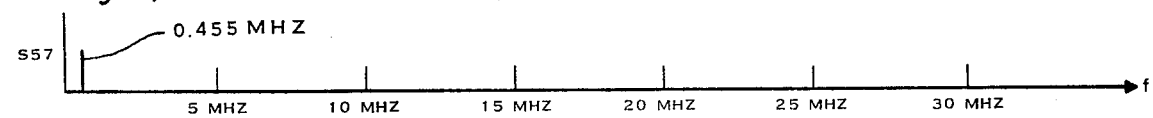
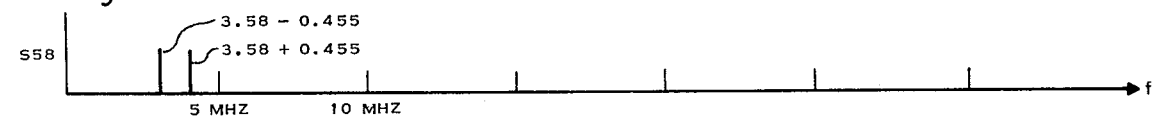
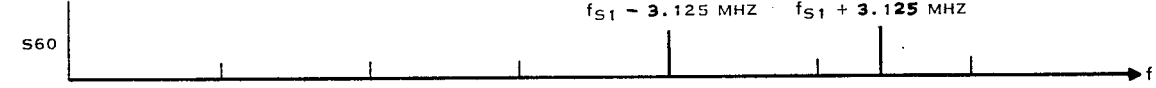

SWITCH 5200

BALANCED MOD. 5300

AM = 1 → CLOSE SW1
AM = 0 → CLOSE SW2

MIXER 5500

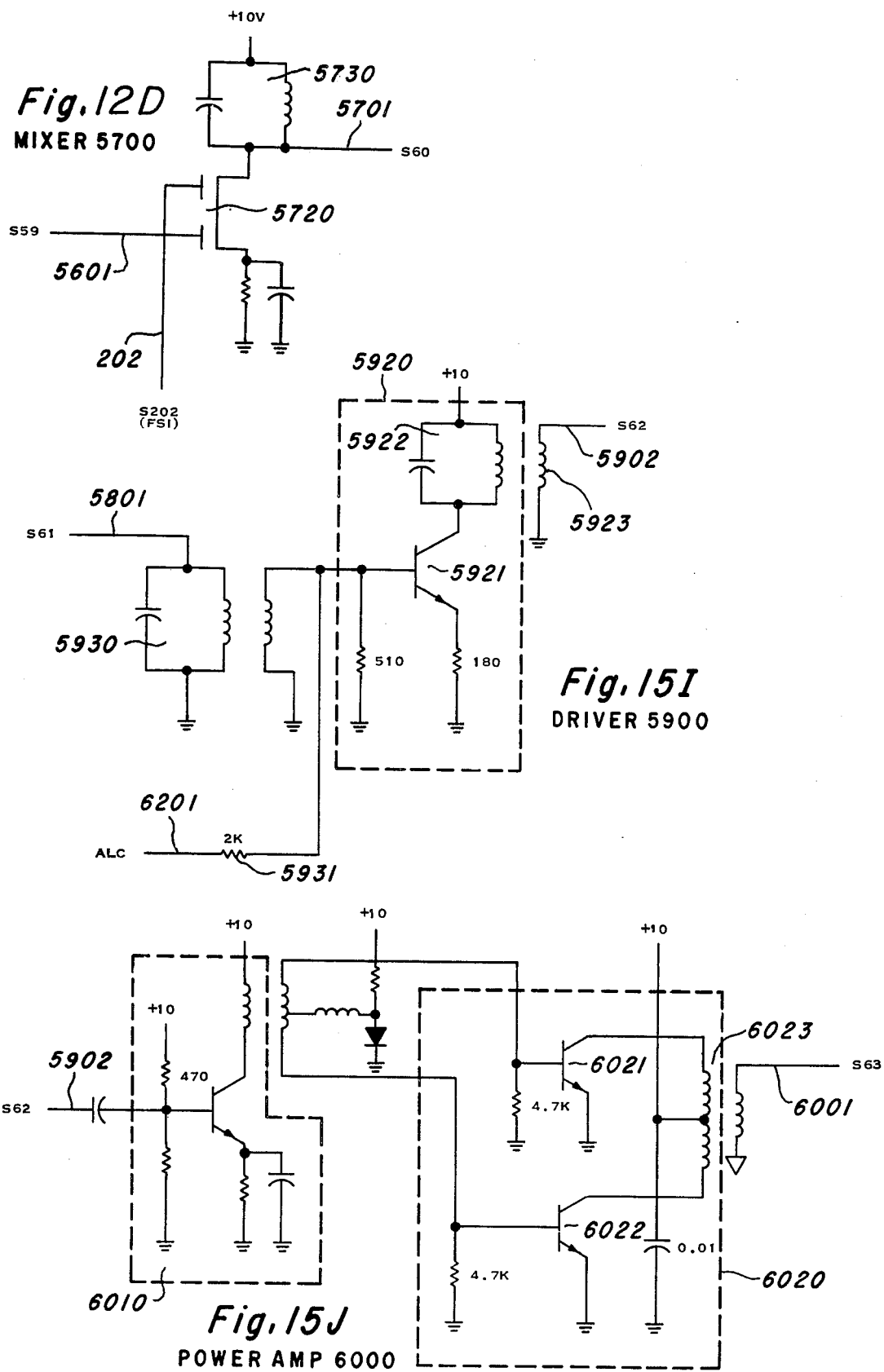

TRANSCEIVER WITH ONLY ONE REFERENCE FREQUENCY

BACKGROUND OF THE INVENTION

This invention relates to analog signal processing, and more particularly to transceivers. This invention further relates to the transceiver and components thereof described and claimed in the following U.S. patent applications filed of even date with and assigned to the assignee of the present invention: U.S. Ser. No. 791,611 entitled "A Digitally Transmitting Transceiver" by Edward R. Caudel and William R. Wilson; U.S. Ser. No. 791,629 entitled "A Clarifying Radio Receiver" by Michael J. Cochran and Edward R. Caudel; U.S. Ser. No. 791,449 entitled "An Automatically Clarifying Radio Receiver" by Michael J. Cochran and Edward R. Caudel; U.S. Ser. No. 791,254 entitled "A Computer Controlled Radio System" by Michael J. Cochran and Edward R. Caudel; U.S. Ser. No. 791,614 entitled "A Charge Transfer Device Radio System" by Michael J. Cochran; U.S. Ser. No. 791,253 entitled "A Transceiver Capable of Sensing a Clear Channel" by Jerry D. Merryman, et al; U.S. Ser. No. 791,265 entitled "A Signal Strength Measuring Transceiver" by Edward R. Caudel; U.S. Ser. No. 791,256 entitled "A Highly Selective Programmable Filter Module" by Michael J. Cochran and Edward R. Caudel; U.S. Ser. No. 791,616 entitled "A Dual Processor Transceiver" by Edward R. Caudel, William R. Wilson and Thomas E. Merrow; U.S. Ser. No. 791,264 entitled "An Electronic Phase Detector Circuit" by Michael J. Cochran.

A transceiver has a transmit mode of operation and a receive mode. In a receive mode, the transceiver receives radiated electronic input signals comprised of a plurality of non-overlapping frequency bands, filters one of the bands from the plurality, frequency shifts the one band from radio frequencies to a lower frequency, and converts the filtered band to audible sounds. The input signals may be amplitude modulated (AM) or single sideband (SSB) signals as an example. Antenna means receive the radiated input signals. Filtering devices are included in the transceiver to select one of the bands from the plurality. Mixing devices are included to frequency shift the selected band, and a demodulator device is included to demodulate the selected band. Similarly, in a transmit mode, a transceiver modulates electrical signals having audio frequencies, frequency shifts the modulated signals to radio frequencies of a selectable channel, and radiates the radio frequencies via an antenna.

A plurality of clocking signals having selectable frequencies are required to implement the above-described transmit and receive operations. For example, the mixing devices which are operable in the receive mode, frequency shift the radiate input signals such that a selected band is aligned to predetermined frequencies in response to the frequency of one of the clocking signals. Similarly, the demodulator device, which is utilized in the receive mode, demodulates in response to the frequency of another clocking signal when single sideband signals are received. Additionally, the mixing devices, which are active in the transmit mode, frequency shift signals from audio frequencies to radio frequencies in response to the frequency of another clocking signal.

In the past, at least two independent reference frequency oscillators were required to generate the clocking signals that the transceiver needed. In some systems, one of the oscillators generates one reference frequency which produces clocking signals for the receive mode of operation; while a second oscillator generates another reference frequency which produces signals for the transmit mode of operation. By comparison, the present invention generates both the transmit clocking signals and the receive mode clocking signals from a single fixed reference frequency. Thus, the present invention has the advantage of eliminating some components which other transceivers previously required.

Another advantage of the presently-described invention is that the clocking signals of the transmit mode and receive mode are synchronized to each other. The synchronization results from the fact that all clocking signals in the described invention are multiples of a single reference frequency. That is, each clocking signal has a frequency of the form K1/K2 times the reference frequency where K1 and K2 are selectable integers. Thus, the difference in frequency between any two clocking signals in the disclosed transceiver is solely dependent upon the integers K1 and K2. By comparison, the difference in frequency of two clocking signals of prior art transceivers is dependent upon the tolerance in the frequency of oscillation of the multiple reference frequency oscillators.

Accordingly, it is one object of the invention to provide an improved transceiver.

It is another object of the invention to provide a transceiver having clocking signals which are all synchronized to each other.

Another object of the invention is to provide a transceiver having clocking signals which are derived from a single reference frequency.

Still another object of the invention is to provide a transceiver having clocking signals whose difference in frequency is independent of the frequency tolerance of multiple oscillators.

SUMMARY OF THE INVENTION

These and other objects are accomplished in accordance with the invention by a transceiver which includes a single crystal oscillator. The oscillator has an output which couples to a plurality of counters and phase locked loops. The counters are utilized to divide the frequency of the crystal oscillator, whereas the phase locked loops are utilized to multiply the frequency of the crystal oscillator. The counters and phase locked loops are intercoupled to generate first, second, and third clocking signals of a first, second, and third selectable frequency, respectively. One of the selectable frequencies is coupled to a mixing means for down frequency shifting signals which are received from an antenna. Another one of the selectable frequencies couples to a filter means to filter a selected one band from a plurality of bands. The remaining selectable frequency couples to a second mixing means for up frequency shifting signals for transmission via an antenna. In one embodiment of the invention, the clocking means includes two phase locked loops for multiplying the reference frequency, and four counting circuits for dividing the reference frequency.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in conjunction with the accompanying drawings; wherein:

FIGS. 4A–4D are detailed circuit diagrams of the mixer 200, mixer 300, CCD filter 700, and detector 900, respectively, included in the signal path of FIG. 2.

FIG. 11 is comprised of GRAPHS 11A–11K which are a series of frequency diagrams illustrating signals at various points on the transmit signal path of FIG. 10.

FIGS. 12A–12D are detailed circuit diagrams of switch 5200, modulator 5300, mixer 5500 and mixer 5700, respectively included in the transmit signal path of FIG. 13.

DETAILED DESCRIPTION OF SPECIFIC EMBODIMENTS

Figure 1:
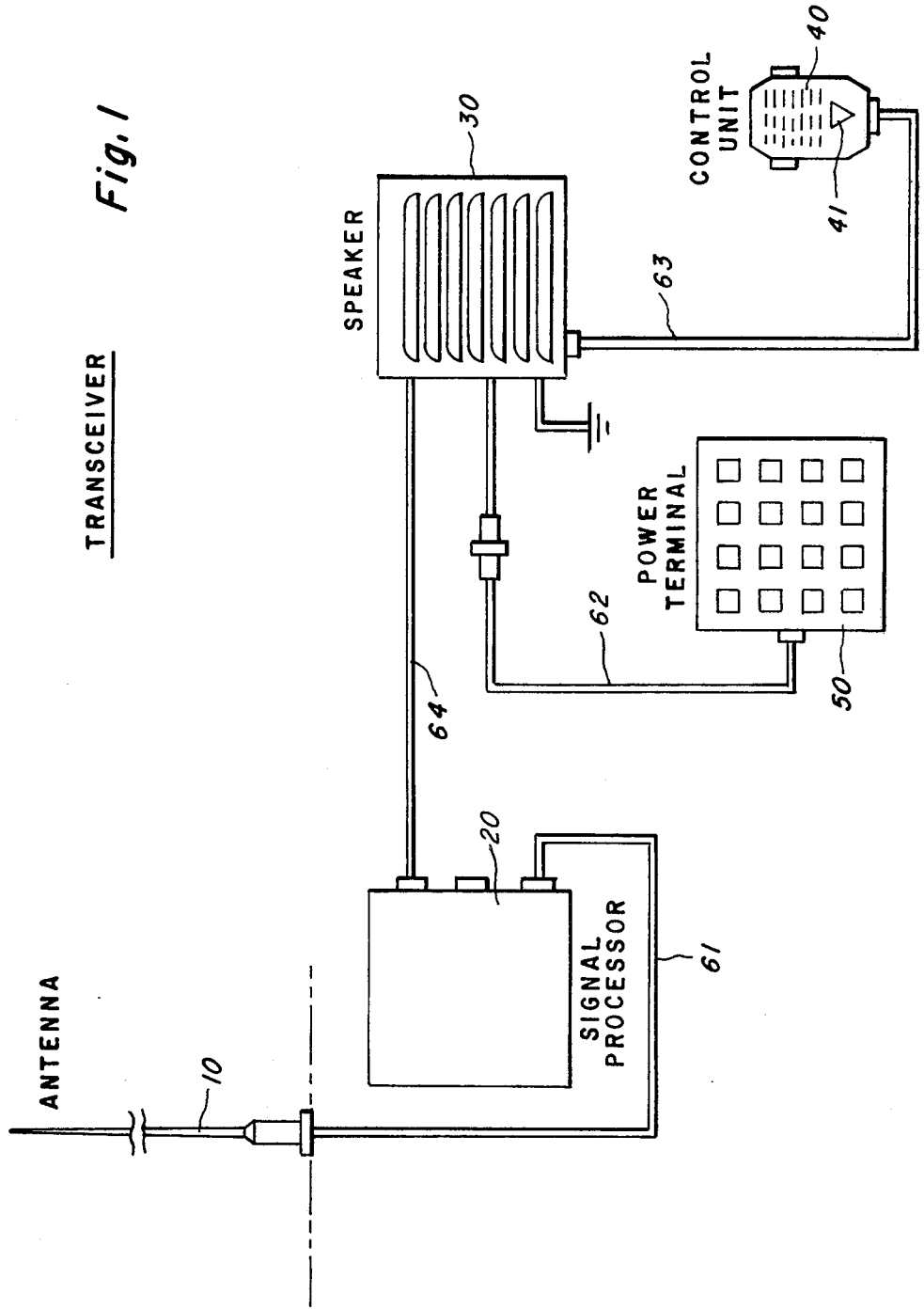
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61–64 as illustrated in FIG. 1.

The transceiver of FIG. 1 has a transmit mode of operation and a receive mode of operation. Basically, in the transmit mode the opeator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
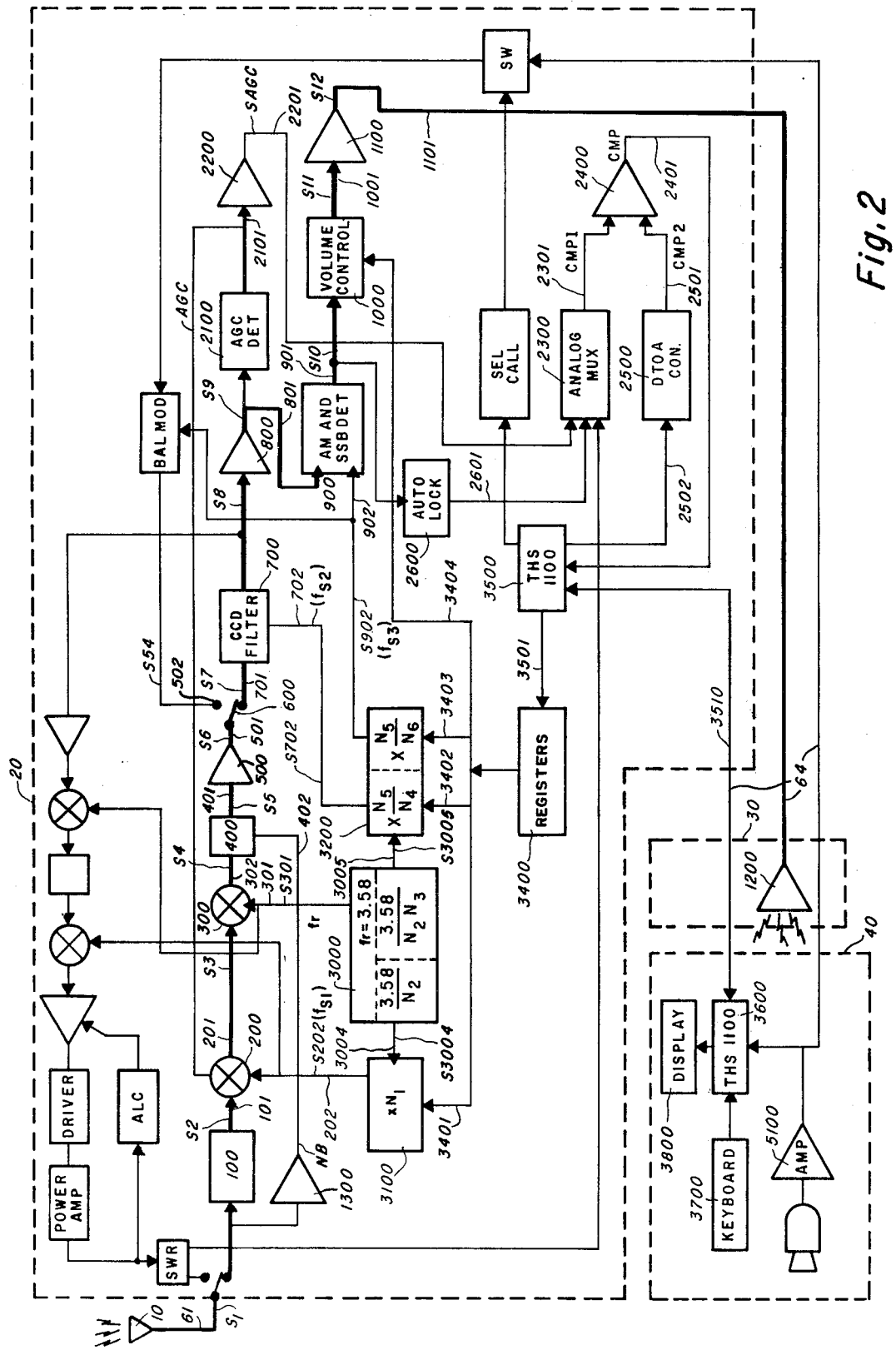
FIG. 2 is a more detailed block diagram of the transceiver of FIG. 1 wherein the receive signal path components are emphasized.
Figure 3:
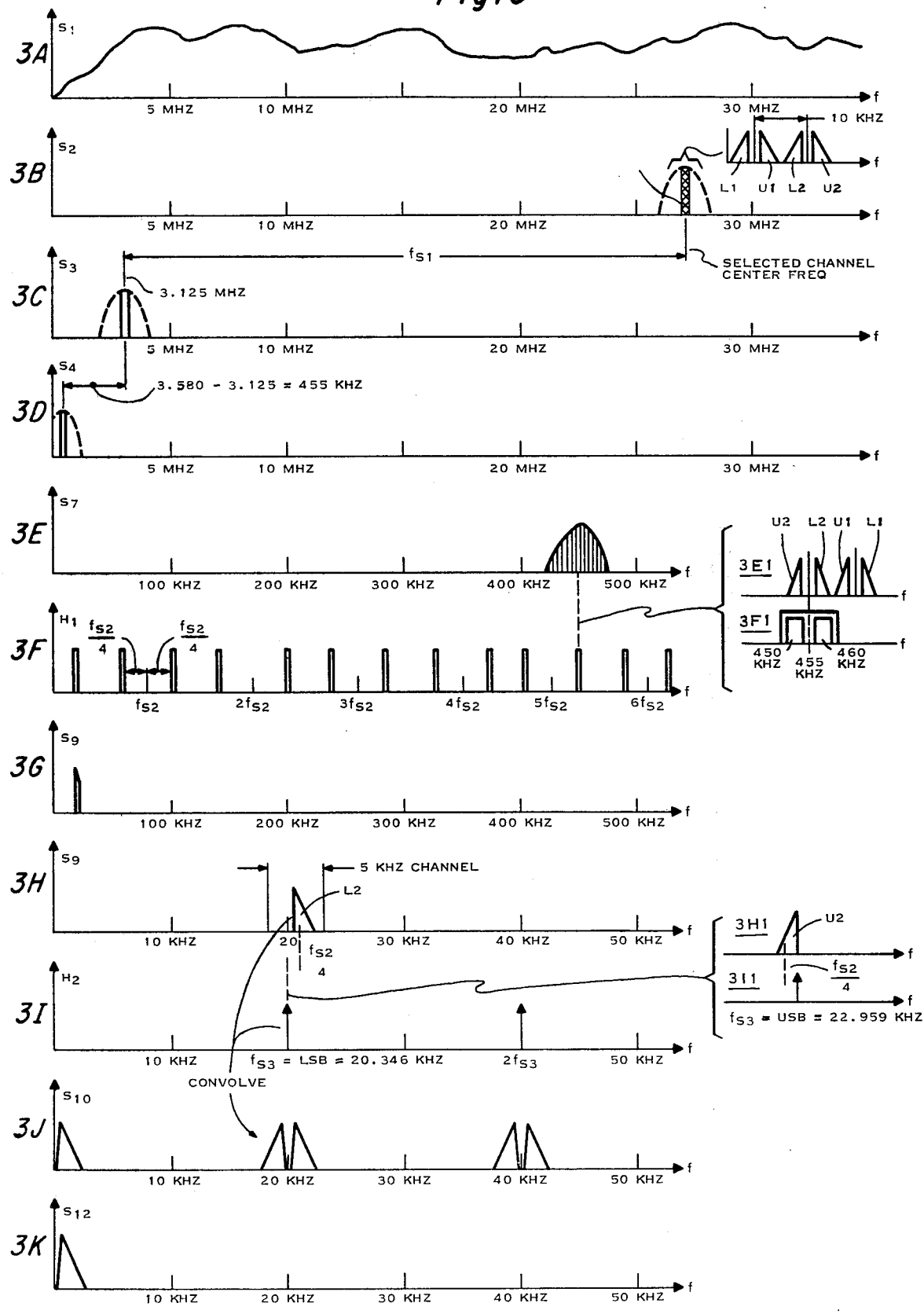
FIG. 3 is comprised of graphs 3A–3K which are a set of frequency diagrams illustrating signals in the frequency domain which are present at various points on the receive signal path of FIG. 2.

The manner in which the transceiver of FIG. 1 performs the above described receive operation is best understood by referring to FIG. 2 and FIG. 3. FIG. 2 is a circuit diagram of transceiver of FIG. 1. The circuit includes a signal path which is operable in the receive mode and which is emphasized in FIG. 2 by a thickened line. Signals S1–S12 are present at various points (as illustrated in FIG. 2) on this signal path. FIG. 3 is a set of frequency diagrams illustrating some of the signals S1–S12 in the frequency domain.

Antenna 10 is the first element of the receive signal path. Cable 61 couples to the output of antenna 10 and signal S1 as illustrated in GRAPHS 3a is generated thereon. Basically, signal S1 is unfiltered and thus is comprised of frequency components which cover the electromagnetic spectrum. Lead 61 couples to filter 100. Filter 100 has an output lead 101 and signals S2 are generated thereon. As illustrated in FIG. 3b, signal S2 has a frequency range of approximately 26 MHz to 28 MHz. The skirt response of filter 100 is not critical as its only function is to pass the band of frequencies lying between 26.965 mHz and 27.405 mHz. This range of frequencies includes 40 amplitude modulated (AM) channels as presently assigned by the FCC. Table I lists the center frequency of each of the 40 channels. Each AM channel is divided into a lower sideband channel and upper sideband channel. FIG. 3b illustrates the 26.965 Mhz–27.405 MHz frequency range by the cross hatched areas S2a. GRAPH 3B1 is a blow up of area S2and signal sideband channels L1, U1, L2, U2, lying within the first two AM channels are illustrated therein.

TABLE I

| CH | CENTER FREQUENCY | CH | CENTER FREQUENCY |
|---|---|---|---|
| 1 | 26.965 | 20 | 27.205 |
| 2 | 26.975 | 21 | 27.215 |
| 3 | 26.985 | 22 | 27.225 |
| X | 26.995 | 24 | 27.235 |
| 4 | 27.005 | 25 | 27.245 |
| 5 | 27.015 | 23 | 27.255 |
| 6 | 27.025 | 26 | 27.265 |
| 7 | 27.035 | 27 | 27.275 |
| X | 27.045 | 28 | 27.285 |
| 8 | 27.055 | 29 | 27.295 |
| 9 | 27.065 | 30 | 27.305 |
| 10 | 27.075 | 31 | 27.315 |
| 11 | 27.085 | 32 | 27.325 |
| X | 27.095 | 33 | 27.335 |
| 12 | 27.105 | 34 | 37.345 |
| 13 | 27.115 | 35 | 27.355 |
| 14 | 27.125 | 36 | 27.365 |
| 15 | 27.135 | 37 | 27.375 |
| X | 27.145 | 38 | 27.385 |
| 16 | 27.155 | 39 | 27.395 |
| 17 | 27.165 | 40 | 27.405 |
| 18 | 27.175 | | |
| 19 | 27.135 | | |
| X | 27.195 | | |

TABLE II

| CH | $f_{s1}$ | CH | $f_{s1}$ |
|---|---|---|---|
| 1 | 23.840 | 20 | 24.080 |
| 2 | 23.850 | 21 | 24.090 |
| 3 | 23.860 | 22 | 24.100 |

TABLE II-continued

| CH | $f_{s1}$ | CH | $f_{s1}$ |
|---|---|---|---|
| X | 23.870 | 24 | 24.110 |
| 4 | 23.880 | 25 | 24.120 |
| 5 | 23.890 | 23 | 24.130 |
| 6 | 23.900 | 26 | 24.140 |
| 7 | 23.910 | 27 | 24.150 |
| X | 23.920 | 28 | 24.160 |
| 8 | 23.930 | 29 | 24.170 |
| 9 | 23.940 | 30 | 24.180 |
| 10 | 23.950 | 31 | 24.190 |
| 11 | 23.960 | 32 | 24.200 |
| X | 23.970 | 33 | 24.210 |
| 12 | 23.980 | 34 | 24.220 |
| 13 | 23.990 | 35 | 24.230 |
| 14 | 24.000 | 36 | 24.240 |
| 15 | 24.010 | 37 | 24.250 |
| X | 24.020 | 38 | 24.260 |
| 16 | 24.030 | 39 | 24.270 |
| 17 | 24.040 | 40 | 24.280 |
| 18 | 24.050 | | |
| 10 | 24.060 | | |
| X | 24.070 | | |

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 MHz. Mixer 200 generates signals S3 by mixing signal S2 with frequency $f_{s1}$, and thus the selected AM channel is centered at the frequency 3.125 MHz. This fact is illustrated in GRAPH 3c. TABLE II lists the value of frequency $f_{s1}$ along side of the number of the selected AM channel.

Lead 201 couples to a second mixer 300. Mixer 300 has a clock input lead 301 and an output lead 302. A clocking signal of 3.58 mHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. GRAPH 3d illustrates signal S4.

Signal S4 passes through a noise blanker 400, and noise blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in GRAPH 3e.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. Copending application, Ser. No. 758,366, entitled, "Frequency Converting Filter," by Jerry Norris and Clinton Hartmann, filed January, 1977, assigned to the same assignee of this application, contains a detailed description of its construction. Basically, the charge coupled device transversal filter is comprised of a plurality of serially connected stages having a split electrode structure defining an impulse response of the form (sine N/N) (cosine $2\pi$ f$_0$N). In this expression, the frequency $f_0$ equals $1/(N_0 \times t_s)$ where the quantity $1/t_s$ equals the selectable frequency $f_{s2}$, and $N_0$ is the number of stages over which the term cosine ($2\pi$ f$_0$t) completes one cycle. The bandwidth $\Delta f$ of each of the passbands equals $1/(t_s N_1)$ where the quantity $1/t_s$ again equals the selectable sampling frequency $f_{s2}$, and $N_1$ equals the number of stages in which the term (sine N)/N passes before reaching its first zero crossing. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency.

In one preferred embodiment, the parameters $N_0$ and $N_1$ are chosen such that the passbands of filter 700 have a center frequency of $N \times f_{s2} \pm \frac{1}{4}f_{s2}$, and the bandwidth of filter 700 equals $1/20f_{s2}$. GRAPH 3f illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity $1/20f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{s2} + \frac{1}{4}f_{s2}$ is aligned with the sideband channel selected from signal S7. This is filter 700's eleventh passband. As illustrated in Table IIIa, a frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. GRAPHS 3E1 is a blow up of signal S7 about the frequency of 455 kHz, and GRAPHS 3F1 is a blow up of GRAPHS 3F about the same frequency. Together, these figures illustrate the alignment of the eleventh passband of filters 700 with the selected channel. It should also be noted, as illustrated in GRAPHS 3E1, that the mixing operation of mixer 300 results in the flip-flopping in frequency of the upper and lower sideband channels. This flip-flopping occurs because the mixing frequency of 3.58 mHz is higher than the center frequency of the selected AM channel, i.e., 3.125 mHz.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz. Table IIIb illustrates that a clocking frequency $f_{s2}$ equal to 202,218 Hz causes filter 700 to have its passband centered at 455 kHz and a bandwidth of approximately 10 kHz. This situation is also illustrated in GRAPHS 3E1 and 3F1.

TABLE IIIa

| $\frac{1}{20} f_{s2}$ | $5f_{s2} + \frac{1}{4} f_{s2}$ | $f_{s2}$ |
|---|---|---|
| 5 kHz | 450 kHz | 86,409 Hz |
| 5 kHz | 460 kHz | 86,932 Hz |

TABLE IIIb

| $\frac{1}{20} f_{s2}$ | $2f_{s2} + \frac{1}{4} f_{s2}$ | $f_{s2}$ |
|---|---|---|
| 10 kHz | 455 kHz | 202,218 Hz |

Lead 703 couples the output of CCD filter 700 to an amplifier 800. Amplifier 800 is tuned to pass only those frequencies lying within the first passband of CCD filter 700. That is, amplifier 800 only passes frequencies lying about $\frac{1}{4}f_{s2}$. Amplifier 800 has an output lead 801 and signals S9 are generated thereon. GRAPH 3G illustrates signal S9 on the same frequency scale as GRAPH 3F (which illustrates the passbands of filter 700); and GRAPH 3H illustrates signal S9 on an expanded frequency scale so that its characteristics are more apparent. In GRAPH 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. Graph 3I illustrates the frequency components of a sampling transfer function H2 which samples at a frequency $f_{s3}$ and graph 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in graph 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200–3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 is coupled to a speaker 30 where the signals S12 shown in FIG. 3 are converted to audible sound.

Figure 4A:
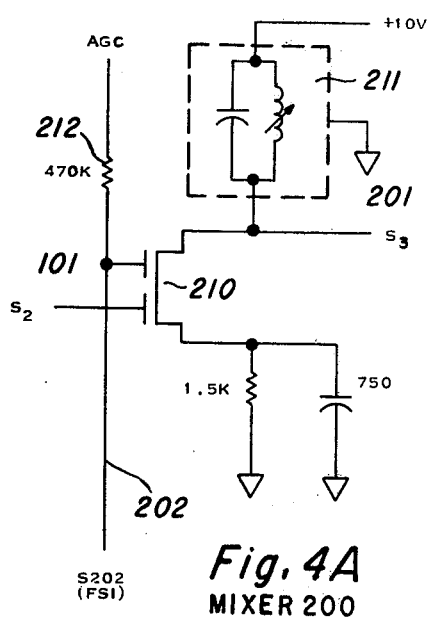

Mixer 200 is illustrated in detail in FIG. 4A. Basically, mixer 200 is comprised of a dual gate MOSFET 210. One of the dual gates couples to signal S2 via lead 101, and the other gate couples to signal S202 via lead 202. The conductance of FET 210 is proportional to the product of the signals on its two gates. Signal S3 on lead 201 is generated at the source of FET 210, and thus it equals the product of signals S2 and S202. A tank circuit 211 having a resonant frequency of 3.125 mHz couples to lead 201. A logic signal FEO couples to the drain of FET 210 through a 10-K resistor 212. When signal FEO is at a high voltage, the gain of mixer 200 increases; whereas, when signal FEO is low, the gain of mixer 200 increases. Signal FEO is thus utilized to logically step the gain of mixer 200 by approximately 40 dB.

FIG. 4B is a detailed circuit diagram of mixer 300. Mixer 300 is also comprised of a dual gaate MOSFET 310. One of the dual gates couples to signal S3 via lead 201, and the other gate couples to signal S301 via lead 301. A bias circuit 312 couples lead 201 to minus 8 volts. A tank circuit 311, having a resonant frequency of 455 kHz, serially couples ten-volts to the source of FET 310 where signal S4 on lead 302 is generated.

Figure 4C:
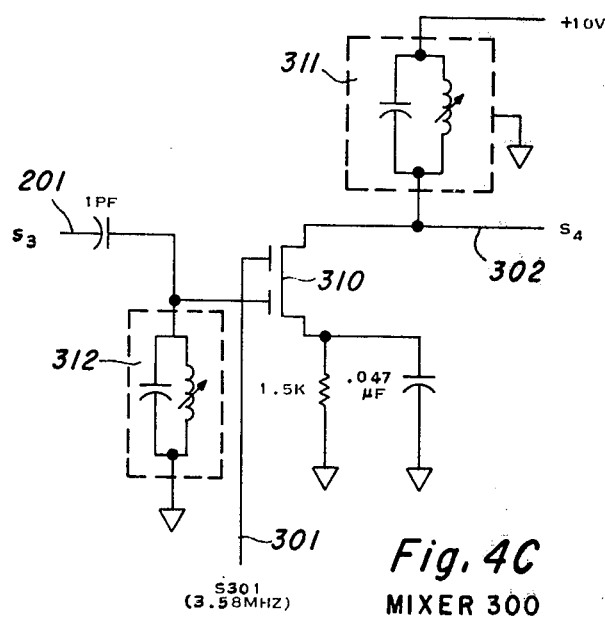

FIG. 4C is a greatly enlarged top view of CCD transversal filter 700. Lead 701 couples to an input stage 710 of filter 700. Lead 702, carrying clocking signals of the second selectable frequency $f_{s2}$, couples to the clocking input 711 of filter 700. As previously described, filter 700 is comprised of a plurality of serially-connected stages 712; and each of the stages has a split electrode. These splits 713 have a profile of the form (sine N/N) (cosine $2\pi f_0 N$). This structure has a plurality of passbands centered about multiples of the frequency $f_{s2}$ as previously described. Lead 703 couples to an output stage 714 of filter 700, and the signals S8 are generated thereon.

Detector 900 is illustrated in FIG. 4D. Basically, detector 900 is comprised two logically-controlled switches 910 and 911 having a common input coupled to lead 801. Logic control inputs, coupled to leads 902 and 903 are provided for logically controlling the operation of switches 910 and 911. Texas Instruments part number TL607 is an example of such a switch. A logic signal AM is applied to lead 903, and signal S902 comprised of the third selectable frequency $f_{s3}$ is applied to lead 902. Switch 910 is permitted to be closed when signal AM is at a high voltage level, while switch 911 is permitted to be closed when signal AM is at a low voltage level. The actual closure of switch 910 and 911 is determined by signal S902. When amplitude-modulated signals are received, signal AM and signal S902 are both at a high voltage level, and thus, signal S9 passes through switch 910. The output of switch 910 is coupled to a diode 912 and a low-pass filter comprised of circuit elements 913 and 914. Lead 901 couples to the output of the low-pass filter. Conversely, when single sideband signals are received, signal AM is at a low voltage level and signal S902 contains the third selectable frequency $f_{s3}$. Thus, switch 911 opens and closes in response to frequency $f_{s3}$. This sampling operation shifts signal S9 down in frequency as was illustrated in FIGS. 3H–3J. The output of switch S9 couples to the low-pass filter and to lead 901.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $F_{s3}$ are generated by modules 3000 and 3200 as multiples of fr 3.58 mHz. These multiples are designated as $N_1$-$N_6$ in FIG. 2. Some of the multiples are fixed, while other multiples are programmable. In the present embodiment, $f_{s1} = f_r (N_1/N_2)$; $f_{s2} = f_r(K_1/K_2)$ or $f_r(N_5/N_2N_3N_4)$; and $f_{s3} = f_r(K_3/k_4)$ or $f_r(N_5/N_2N_3N_6)$. TABLE IV lists the selectable frequencies $f_{s1}$, $f_{s2}$, $f_{s3}$ along with the multiples $N_1$-$N_6$ and the intermediate clocking signals S3004 and S3005 as a function of the particular single sideband channel or AM channel that is to be received.

As the preceding description pointed out, sideband signals may lie anywhere within their assigned 5-kHz channel, and thus it is desirable to control the selectable frequency $f_{s2}$ in fine increments. TABLE IV implies how this fine incremental control is obtained. Signal S3005 has a fixed frequency of 250 hertz and multiplier $N_4$ is fixed at 55. This produces a frequency of 250 Hz/55 or approximately 5 Hz. Thus, by constructing multiplier $N_5$ as a programmable multiplier, frequency $f_{s2}$ is controllable in increments of approximately 5 Hz.

Figure 5:
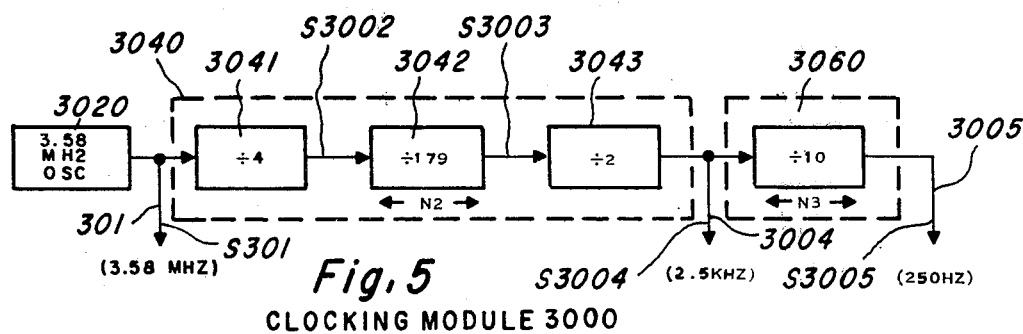
FIG. 5 is detailed circuit diagram of a clocking module 3000 included within FIG. 2.

FIGS. 5-8 illustrate the details of clocking modules 3000-3200. Referring first to FIG. 5, the details of clocking module 3000 are therein illustrated. Clocking module 3000 is comprised of a 3.58 mHz oscillator 3,020, a divide by $N_2$ logic circuit 3040 and divide by 10 logic circuit 3060.

The divide-by-$N_2$ logic circuit 3040 is comprised of a divide-by-four counter 3041, a divide-by-179 counter 3042, and divide-by-2 counter 3043. FIG. 5c illustrates the details of counters 3041 and 3042. Counter 3041 is comprised of two D-type flip flops 3043. Each of the flip flops have their $\overline{Q}$ output coupled to their D input to thereby provide a divide-by-4 counter. Flip flops 3043 may be comprised of the commercially-available

TABLE IV

| | SSB-CH | | | | AM-CH | |
|---|---|---|---|---|---|---|
| | 1L | 1U | 2L | 2U | 1 | 2 |
| $osc_{fr}$ | 3.58MHZ → | → | → | → | → | → |
| $f_{s1}$ | 23.84MHZ | 23.84MHZ | 23.85MHZ | 23.85MHZ | 23.84MHZ | 23.85MHZ |
| $N_2$ | 1432 → | → | → | → | → | → |
| S3004 | 2.5KHZ → | → | → | → | → | → |
| $N_1$ | 9,536 → | → | 9,540 → | → | 9,536 | 9,540 |
| $f_{s2}$ | 86,932HZ | 86,409HZ. 86,932HZ | 86,409HZ | 202.218-HZ | | |
| $N_3$ | 10 → | → | → | → | → | → |
| S3005 | 250HZ → | → | → | → | → | → |
| $N_4$ | 55 → | → | → | → | 24 → | → |
| $N_5$ | 19,125 | 19,010 | 19,125 | 19,010 | 19,413 | 19,413 |
| $f_{s3}$ | 20,345HZ | 22,959HZ | 20,345HZ | 22,959HZ | H | H |
| $N_6$ | 235 | 207 | 235 | 207 | X | X |

Some of the information in TABLE IV can be correlated with the preceding description. Compare, for example, the $f_{s1}$ frequency listings of TABLE II, with the entries in TABLE IV. Also compare the TABLE III entries of $f_{s2}$, with the TABLE IV entries of $f_{s2}$. And further compare the demodulating clocking frequency $f_{s3}$ of FIGS. 3I and 3I1 with the $f_{s3}$ entries in TABLE IV.

Given the values of $f_{s1}$, $f_{s2}$ and $f_{s3}$ as listed in TABLE IV, $N_1$-$N_6$ must be chosen such that the desired frequencies are obtained. To this end, multiplier $N_2$ is chosen to be 1432. Thus, signal S3004 is a fixed frequency of 2.4 kHz. Accordingly, a selectable frequency $f_{s1}$ of 23.84 kHz is obtained by setting $N_1$ to 9,536 or 9,540, respectively.

As TABLE IV further illustrates, the multiplier $N_3$ is fixed at a value of 10. Thus, signal S3005 is a fixed frequency of 250 Hz. And therefore, selectable frequency $f_{s2}$ becomes 86,932 (as required to receive lower sideband signals) when multiplier $N_5$ equals 19,125. Similarly, frequency $f_{s2}$ equals 86,409 or 202,218 when multiplier $N_5$ equals 19,010 or 19,413, respectively.

Selectable frequency $f_{s3}$ is generated by appropriately choosing $N_6$. As illustrated in TABLE IV, frequency $f_{s3}$ is suitable for demodulating lower sideband channels when $N_6$ equals 235, and is suitable for demodulating upper sideband channels when multiplier $N_6$ equals 207.

74LS174, as an example.

Figure 6:
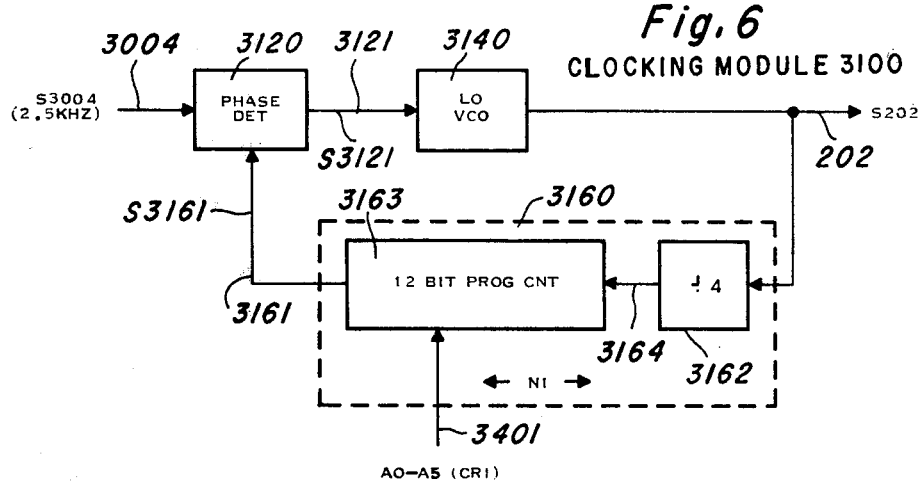
FIG. 6 is detailed circuit diagram of a clocking module 3100 included within FIG. 2.

FIG. 6 illustrates the circuit details of clocking module 3100. As illustrated in FIG. 6, clocking module 3100 is implemented by means of a phase lock loop. The phase lock loop is comprised of a phase detector 3120, a voltage controlled oscillator (VCO) 3140, and a programmable counter 3160. Phase detector 3120 has a first input coupled to lead 3004 and a second input coupled to an output of programmable counter 3160 via a lead 3161. A lead 3121 couples an output of phase detector 3120 to an input of VCO 3140. Lead 202 couples an output of VCO 3140 to an input of counter 3160 thereby completing the phase locked loop.

Note that the clocking means herein described utilizes only a single reference frequency (single crystal oscillator) from which all of the mixing frequencies and modulating frequencies are derived. This clocking means may also be utilized in transceivers which perform the sideband filtering with crystal filters. Such a crystal filter is described, for example, in the *Radio Amateur's Handbook* on pages 414-419, published by the American Radio Relay Leaque in 1976. The crystal filter therein described would replace charge coupled device filter 700, and the frequency shifting performed by filter 700 would be performed by altering frequencies $f_{s1}$, $f_{s3}$, or by adding an additional mixer.

Figure 7:
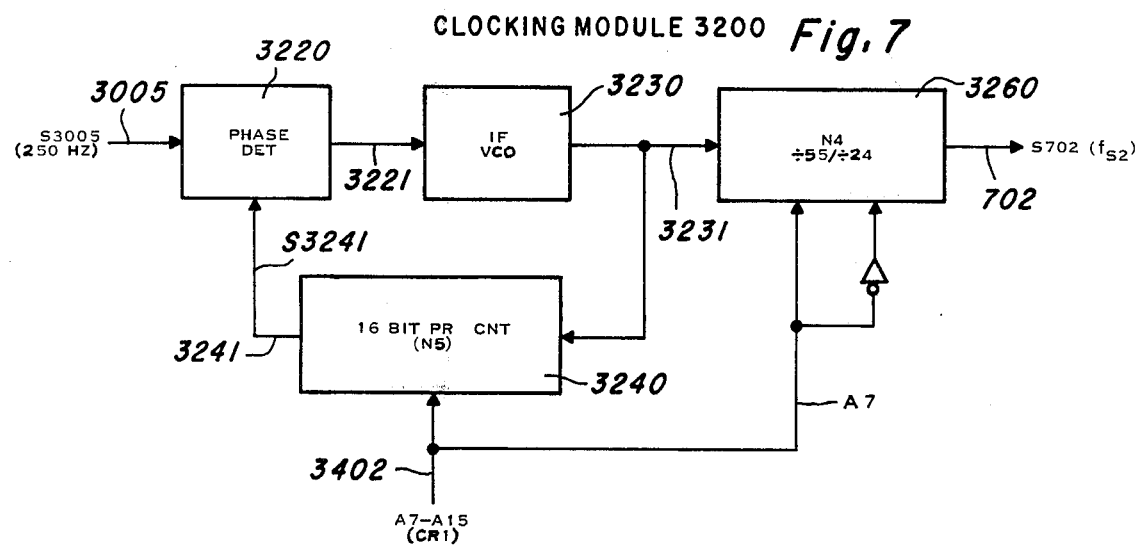
FIG. 7 is detailed logic diagram of a clocking module 3200 included within FIG. 2.

A block diagram of clocking module 3200 is illustrated in FIG. 7. As therein illustrated, the N5 factor is implemented by means of a phase lock loop. This loop is similar in structure to the phase lock loop which was utilized to implement the N1 factor as described in FIG. 6. The phase lock loop in FIG. 7 is comprised of a phase detector 3220, a VCO 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VCO 3230. A lead 3231 couples an output of VCO 3230 to an input of counter 3240, thereby completing the loop.

Figure 8:
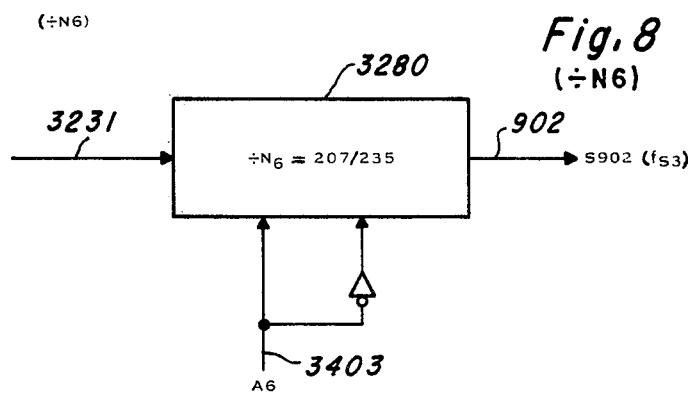
FIG. 8 is detailed logic diagram of a divide by N6 counter which forms a portion of clocking module 3200.

FIG. 8 illustrates the details of the divide-by-N6 counter which is utilized to generate the third selectable frequency $f_{s3}$. As therein illustrated, the divide N6 counter 3280 is similar in construction to the previously-described counters. That is, it is comprised of two, four-bit up counters 3285 and 3286 which are identical to the previously-described counters 3044 and 3045. The data inputs of these counters are selectively set to be the ones complement of 235 when the logic signal A6 is high, and the ones complement of 207 when the logic signal A6 is low. A logic gate 3288 couples to lead 902, and the logic signal S902 comprised of the third selectable frequency $f_{s3}$ is generated thereon.

Figure 9:
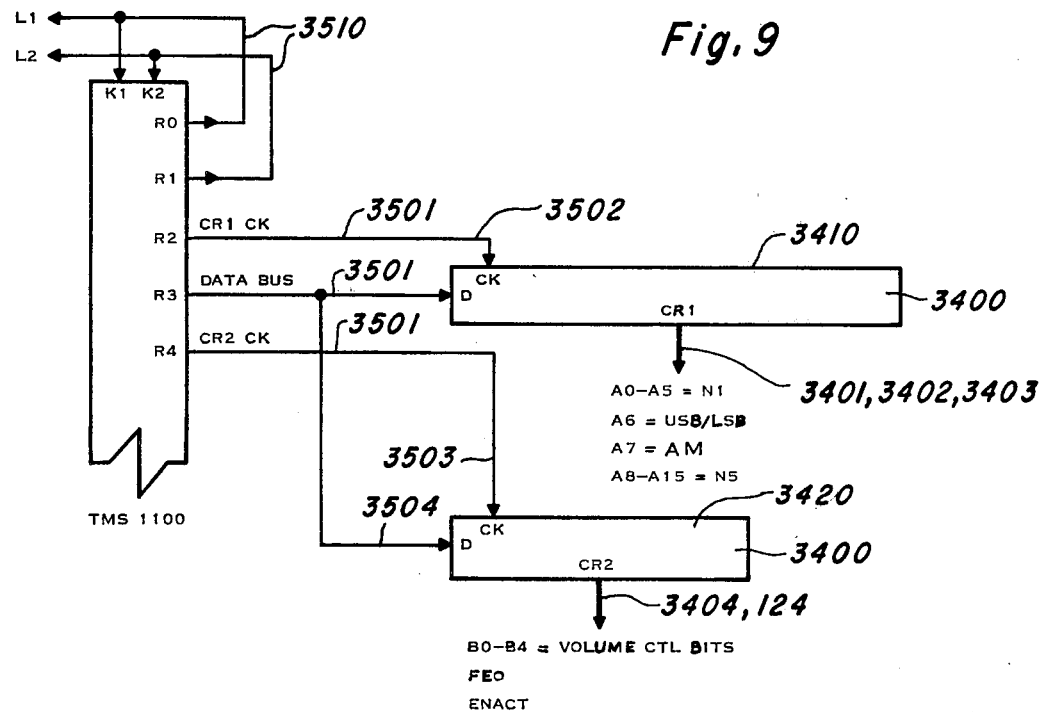
FIG. 9 is a circuit diagram illustrating the source of logic signals which are utilized by clocking modules 3000–3200 of FIGS. 5–8.

Referring now to FIG. 9, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Output bits 0–6 of register 3410 are coupled to lead 3401 and signals A0–A6 are generated thereon. Output bits 7–15 of register 3410 are coupled to leads 3402 and signals A7–A15 are generated thereon. Output 3410 is coupled to lead 3403 to generate signal A6.

The second register 3420 is a seven-bit register. It has output bits 0–4 coupled to leads 3404 to thereby provide the volume control logic signals B0–B4. Bit 5 of register 3240 is coupled to lead 124 to provide previously described logic signal FE0. Bit 6 of register 3240 provides a logic signal ENACT (enable auto call transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al assigned to Texas Instruments Incorporated.

The TMS1100 includes an 11-bit output register having bits labeled R0–R10. As illustrated in FIG. 9, bit R2 is coupled to the clocking input of register 3410 via a lead 3502, and a clocking signal CR1CK is generated thereon. Similarly, bit R4 is coupled to the clocking input of register 3420 via a lead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1–N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000–3200 may be implemented with circuits other than those illustrated in FIGS. 5–8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to $\frac{1}{4}$. For example, k could equal $\frac{1}{8}$, in which case the values of N1–N6 would be scaled appropriately.

Figure 10:
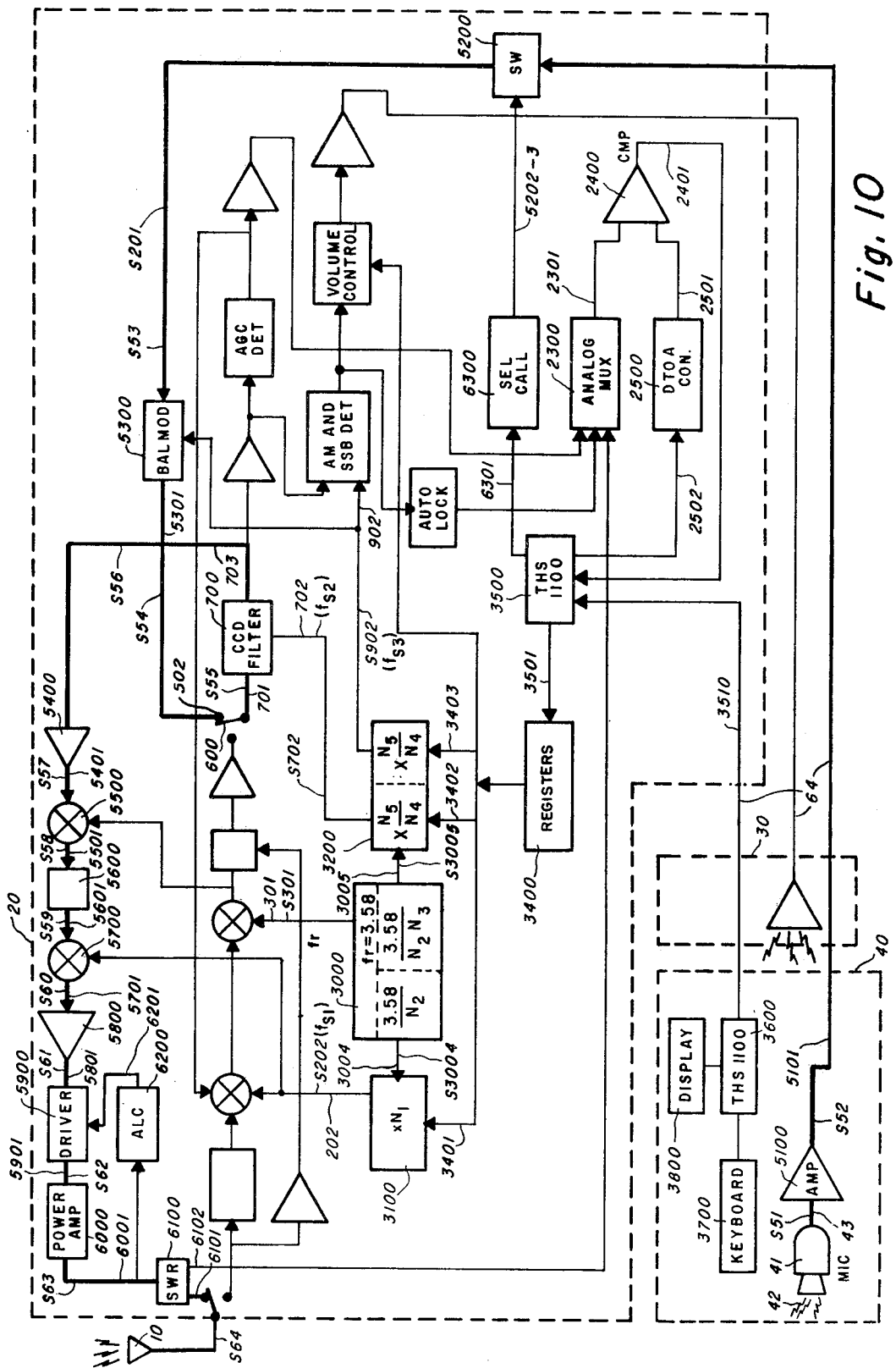
FIG. 10 is a circuit diagram identical to FIG. 2 with the exception that the transmit signal path components are emphasized rather than the receive signal path components.

The operation of the transceiver of FIG. 1, while it is in the transmit mode, will now be described in conjunction with FIGS. 10 and 11. FIG. 10 is identical to the previously described FIG. 2, except that FIG. 10 contains reference numerals identifying those components of the transceiver which are utilized in a transmit mode, whereas FIG. 2 contains reference numerals identifying those components used in the receive mode. Also, in FIG. 10, the transmit signal path is emphasized by a thickened line, whereas in FIG. 2, the receive signal path is emphasized by a thickened line. Signals S51–S64 are generated at various points on the transmit signal path as indicated in FIG. 14.

Microphone 41 is the first component included within the transmit signal path. Microphone 41 receives sound waves 42, and in response thereto, generates electronic signals S51 on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Modulator 5300 generates signals S54 by sampling signals S53 at a frequency $f_{s3}$ of approximately 22 kHz. GRAPHS 11B and 11c illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

In the transmit mode, filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen as designated in TABLE V such that the desired filtering is performed. GRAPH 11D illustrates the passbands of filter 700 when it is clocked to pass only the lower sideband. As was the case for the previously-described read mode of operation, the 11th passband of filter 700 is used to filter sidebands from an input signal; whereas, the fifth passband of filter 700 is used to filter an AM band from an input signal.

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. GRAPHS 11E and 11F illustrate signals S56 and S57 in the frequency domain. As therein illustrated, signal S56 includes a plurality of filtered frequency bands; whereas, signal S57 includes only that band which is nearest to 455 kHz.

TABLE V

| $f_{s2}$ | MODE |
| --- | --- |
| 86,409 Hz | USB |
| 86,932 Hz | LSB |
| 202,218 Hz | AM |

Lead 5401 couples to the input of a mixer 5500. Mixer 5500 has a clocking input which is coupled to a lead 301 for receiving signals S301 thereon. Signal S301 includes a fixed 3.58-mHz frequency, and it is generated as described supra. Mixer 5500 has an output coupled to a lead 5501, and signals S58 are generated thereon. Signals S58 equal signals S57 frequency shifted to 3.58 mHz±455 kHz.

Lead 5501 couples to the input of the filter 5600. Filter 5600 is tuned to only pass frequencies near 3.125 mHz. The output of filter 5600 is coupled to a lead 5601, and signals S59 are generated thereon. GRAPH 11I illustrates signals S59 in the frequency domain.

Lead 5601 couples to the input of a mixer 5700. Mixer 5700 has a clocking input which couples to lead 202 for receiving signals S202. Signals S202 are generated as previously described, and contain the first selectable frequency $f_{s1}$. Frequency $f_{s1}$ is selectively chosen such that the sum of $f_{s1}+3.125$ mHz equals the center frequency of the channel on which signals S51 are to be broadcast. Mixer 5700 has an output coupled to a lead 5701, and signals S60 are generated thereon. Signals S60 equal signals S59 frequency shifted to $f_{s1}\pm3.125$ mHz as indicated in GRAPH 11J.

An amplifier 5800 is coupled to receive signal S60, and to tune out the lower band of frequencies. GRAPH 11K illustrates the frequency spectrum of signal S61.

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in GRAPH 11K.

Figure 12A:
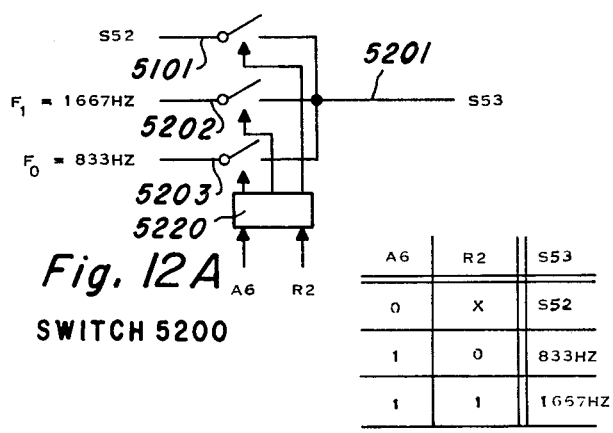

FIG. 12A is a functional schematic of switch 5200. Switch 5200 has three signal inputs coupled to leads 5101, 5202 and 5203 for receiving signals S52, $f_0$, and $f_1$, respectively. A logic enabling network 5220 is provided for receiving signals A6 and R2. Signals A6 and R2 logically pass one of the three input signals through switch 5200. FIG. 15B includes a truth table indicating this logical operation.

Figure 12B:
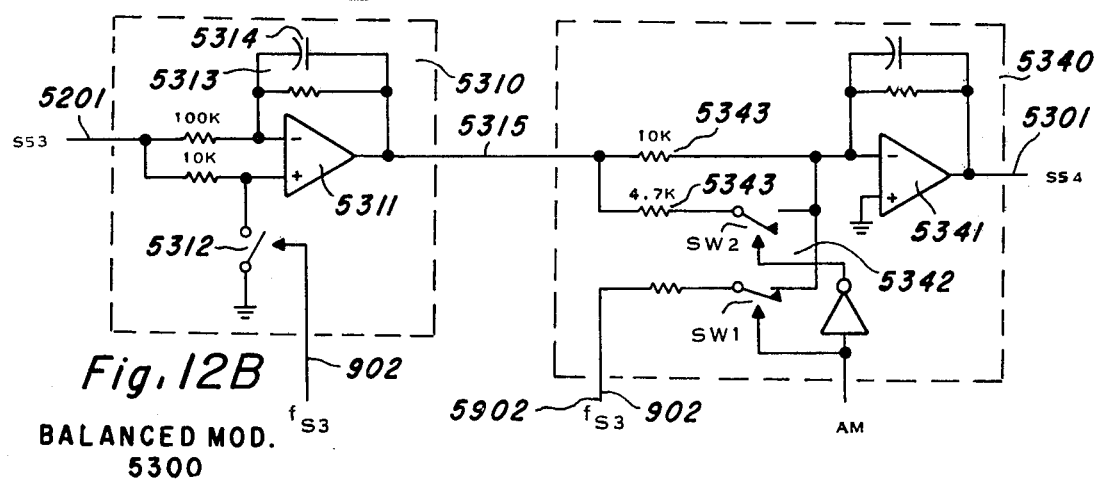

A detail circuit diagram of balanced modulator 5300 is illustrated in FIG. 12B. Basically, modulator 5300 is comprised of a sampling circuit 5310, and a carrier inserting circuit 5340. Sampling circuit 5310 includes an operational amplifier 5311 having a negative input coupled to receive signals S53 through a 100K resistor, and a positive input coupled to receive signals S53 through a 10K resistor. A logically controlled switch 5312 is provided to couple the positive input of amplifier 5311 to ground in response to signal S902. Thus, amplifier 5311 samples signals S53 at the frequency $f_{s3}$. A feedback circuit 5313 is provided for amplifier 5311 which includes a capacitor 5314 for smoothing the sharp voltage transitions which are generated at the output of the amplifier 5311 due to the sampling operation.

The output of amplifier 5311 is coupled via a lead 5315 to the input of carrier inserting circuit 5340. Carrier inserting circuit 5340 includes an operational amplifier 5341 and a logically controlled switch 5342. Logic signal AM controls the operation of switch 5342. When signal AM is true, switch 5342 passes signal S902 to an input of operational amplifier 5341. Conversely, when signal AM is false, signal S902 is inhibited from passing to the input of amplifier 5341. A resistive network 5343 couples the sampled S53 signal from lead 5315 to the input of operational amplifier 5341. Amplifier 5341 adds the sampled S53 signal with the output of switch 5342. Signal S54 on lead 5301 equals this sum.

Signals S54 couples to an input of switch 600 which, in turn, couples to CCD filter 700. Switch 600 is illustrated in FIGS. 2 and 10.

Figure 12C:
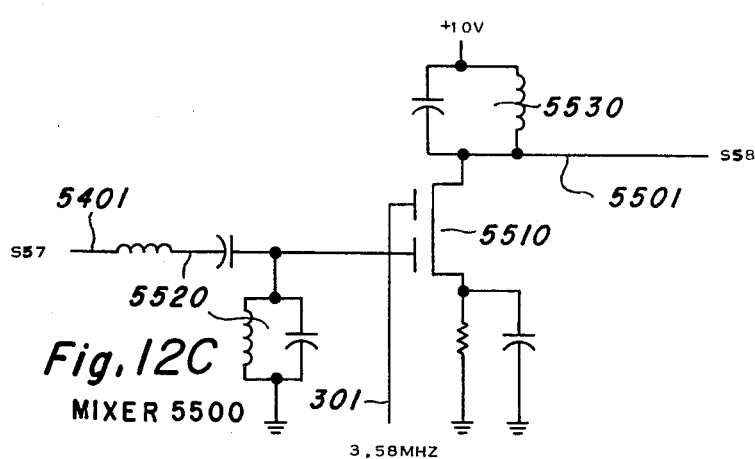

Signal S57 couples to mixer 5500 as illustrated in FIG. 12C. Mixer 5500 is constructed similar to mixer 300 which is illustrated in the previously-described FIG. 4C. Mixer 5500 includes a dual-gate FET 5510. One of the gates is coupled to receive signal S57 through a filter 5520 which has a resonant frequency of 455 KHz.

A detailed circuit diagram of mixer 5700 is provided by FIG. 12D. Mixer 5700 is similar in construction to the previously described mixer 200 of FIG. 4A. Mixer 5700 includes a dual-gate FET 5720. One of the gates is coupled to receive signal S59, and the other gate is coupled to receive signal S202 containing the first selectable frequency $f_{s1}$. A tank circuit 5630 having a resonant frequency of approximately 27 mHz has an output coupled to the source of FET 5720. Signals S60 are generated at the source of FET 5720.

All of the previously described details may be interrelated by considering typical transceiver operations in conjunction with the transceiver block diagrams of FIGS. 2 and 13. Referring to FIG. 2, for example, suppose an operator wishes to operate on channel 1 in the lower sideband mode. Utilizing keyboard 3,700, the operator sequentially depresses digit keys 0 and 1, and control key LB. In response thereto, processor 3,600 senses the depressed keys, and sends messages via leads 3,510 to the slave processor 3,500. These messages were detailed in Table VI under the heading "Channel Select and Mode."

Slave processor 3,500 interprets the messages and in response thereto sends microcommands to registers 3,400 via leads 3,501. The microcommands indicate clocking frequencies $f_{S1}$, $f_{S2}$, $f_{S3}$, such that the lower sideband of channel 1 will pass through the received signal path. The previously described Table IV indicates the details of these microcommands. In particular, the microcommands will indicate an $N_1$ of 9,536; and $N_4$ of 55; an $N_5$ of 19,125; and an $N_6$ of 235. Recall that the values of N2 and N3 are fixed at 1,432 and 10, respectively. As a result of these microcommands, clocking module 3,100 generates clocking signal S202 of a frequency 23.84 MHZ. Similarly, clocking module 3,200 generates clocking signal S702 with frequency 86,932 and also generates clocking signal S902 with a frequency of 20,345HZ.

Mixer 200 mixes signals S2 and frequency $f_{S1}$ to thereby generate signals S3 on lead 201. Frequency $f_{S1}$ was chosen such that channel 1 of signal S3 is centered at frequency 3.125 MHZ because mixer 200 includes a tank circuit having a resonant frequency of 3.125 MHZ. As such, signal S3 discriminates between the selected channel and the surrounding channels.

Mixer 300 mixes signal S3 with the fixed frequency of 3.58 MHZ. The difference between 3.58 MHZ and 3.125 MHZ equals 455 KHZ; and mixer 300 includes a tank circuit having a center frequency of 455 KHZ. Thus, the output of mixer 300, which is signal S4, contains channel 1 at 455 KHZ.

Signal S4 is coupled to CCD filter 700 through a switch 600. Switch 600 is controlled by microcommands from processor 3,500. The microcommands are generated in response to the manually activated PTT key on keyboard 3,700.

Filter 700 receives signals S5 and filters the lower sideband from the signal in response to frequency $f_{S2}$ of clocking signals S702. The previously described Table III lists the appropriate $f_{S2}$ frequency. Signal S8, which is the output of the filter, is the lower sideband of channel 1 as the operator selected.

Signal S8 passes through the modulator 900. The modulator 900 simultaneously receives clocking signals on leads 902 which contain the third selectable frequency $f_{S3}$. Demodulator 900 samples the selected sideband signals at frequency $f_{S3}$; and as a result, the selected sideband is frequency shifted to the audio range.

The demodulator output is coupled via lead 901 to volume control unit 1,000, which amplifies its input signals in response to microcommands. These microcommands are entered into register 3,400 by processor 3,500 in response to messages from processor 3,600 indicating that the operator depressed the V↑ or V↓ key. Audio amplifier 1,100 amplifies the output of the volume control unit, and the output of the amplifier is coupled to speaker 1,200.

When the operator wishes to transmit on his selected channel, he simply pushes the PTT key on keyboard 3,700. As a result, processor 3,600 sends a message to the slave processor 3,500 via leads 3,510, as indicated in Table VI. In response thereto, processor 3,500 generates microcommands which couple the input to filter 700 to the transmit path, and which couple the antenna to the transmit path.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A transceiver comprised of:
   (a) first mixer means having inputs coupled to simultaneously receive (1) input signals comprised of a plurality of non-overlapping frequency channels and (2) mixing frequency signals of a second selectable frequency, for generating in response thereto, first mixer output signals in which said input signal is shifted in frequency such that the center frequency of a selected one of said frequency channels is shifted to a predetermined frequency;
   (b) filter means coupled to said mixer means for defining a frequency range of said first mixer output signals around said predetermined center frequency to filter out all but said selected one of said frequency channels;
   (c) detector means having an input coupled to said filter and coupled to receive first clocking signals of a first selectable frequency for demodulating said selected one frequency channel;
   (d) first transducer means coupled to said demodulator means for converting said demodulated frequency channel into audible sound;
   (e) second transducer means for converting audible sound into information signals;
   (f) modulator means having inputs coupled to said second transducer means for receiving said information signals and coupled to receive first clocking signals of said first selectable frequency for modulating said information signals in response to said first selectable frequency;
   (g) switch means selectively coupling said first mixer means and said modulator means to said filter means;
   (h) second mixer means having inputs coupled to simultaneously receive (1) input signals from said filter means and (2) mixing frequency signals of said second selectable frequency, for generating in response thereto, second mixer output signals in which said input signal is shifted in frequency such that the center frequency of the filtered frequency channel is shifted to a predetermined frequency;
   (i) means for coupling said second mixer means to an antenna means for transmission of said second mixer output signals;
   (j) reference frequency generator means for generating clocking signals of a single reference frequency;
   (k) mixing frequency generator means comprised of programmable counter means coupled to said reference frequency generator means for selectively generating said second selectable frequency to said first and second mixer means; and (l) modulator/detector clocking means comprised of programmable counter means coupled to said reference frequency generator means and to said modulator means and to said detector means for generating said first selectable clocking signals thereto.

2. The transceiver according to claim 1 wherein said first mixer means includes first and second mixer stages, said first mixer stage being coupled to said mixing frequency generator means for mixing said first mixer input signals with said second selectable frequency and said second stage being coupled to said reference frequency generator means for mixing the output signal from said first stage with said reference frequency.

3. The transceiver according to claim 1 wherein said second mixer means includes first and second mixer stages, said first mixer stage being coupled to said mixing frequency generator means for mixing said second mixer input signals from said filter means with said second selectable frequency and said second stage being coupled to said reference frequency generator means for mixing the output signal from said first stage with said reference frequency.

4. The transceiver according to claim 1 wherein said modulator/detector clocking means is comprised of:
  (i) a phase locked loop having an input for receiving said reference frequency $f_r$ and a feedback loop comprised of a first programmable counter means of programmable count $K_3$, and
  (ii) a second programmable counter of programmable count $K_4$ coupling said phase locked loop to said filter means, said clocking means generating clocking signals at said selectable frequency $f_{s3} = f_r(K_3/K_4)$ where $K_3$ and $K_4$ are integers determined by programming signals applied to said first and second programmable counters.

5. The transceiver according to claim 1 wherein said mixer frequency generator means is comprised of:
  (i) a phase locked loop having an input for receiving said reference frequency $f_r$ and a feedback loop comprised of a first counter means of count N, and
  (ii) a second programmable counter of programmable count $N_2$ coupling said phase locked loop to said filter means, said clocking means generating clocking signals at said selectable frequency $f_{s1} = f_r(N_1/N_2)$ where $N_1$ and $N_2$ are integers with $N_2$ being determined by programming signals applied to said second programmable counter.

6. The transceiver according to claim 1 wherein said filter means is a clocked filter means wherein said frequency range is adjustable in dependence upon the frequency of a filter clocking signal applied thereto and wherein said transceiver further includes filter clocking means comprised of programmable counter means coupled to said reference frequency generator means for selectively generating said filter clocking signal to said filter means.

7. The transceiver according to claim 6 wherein said filter means is a charge coupled device transversal filter.

8. The transceiver according to claim 6 wherein the center frequency of said filter means is also adjustable in dependence upon the frequency of said filter clocking signal.

9. The transceiver according to claim 6 wherein said filter clocking means is comprised of:
  (i) a phase locked loop having an input for receiving said reference frequency $f_r$ and a feedback loop comprised of a first programmable counter means of programmable count $K_1$, and
  (ii) a second programmable counter of programmable count $K_2$ coupling said phase locked loop to filter means, said clocking means generating clocking signals at said selectable frequency $f_{s2} = f_r(K_1/K_2)$ where $K_1$ and $K_2$ are integers determined by programming signals applied to said first and second programmable counters.

10. A transceiver comprised of:
(a) first mixer means having inputs coupled to simultaneously receive (1) input signals comprised of a plurality of non-overlapping frequency channels and (2) mixing frequency signals of a second selectable frequency, for generating in response thereto, first mixer output signals in which said input signal is shifted in frequency such that the center frequency of a selected one of said frequency channels is shifted to a predetermined frequency;
(b) filter means coupled to said mixer means for defining a frequency range of said first mixer output signals around said predetermined center frequency to filter out all but said selected one of said frequency channels;
(c) detector means having an input coupled to said filter and coupled to receive first clocking signals of a first selectable frequency for demodulating said selected one frequency channel;
(d) first transducer means coupled to said demodulator means for converting said demodulated frequency channel into audible sound;
(e) second transducer means for converting audible sound into information signals;
(f) modulator means having inputs coupled to said second transducer means for receiving said information signals and coupled to receive first clocking signals of said first selectable frequency for modulating said information signals in response to said first selectable frequency;
(g) switch means selectively coupling said first mixer means and said modulator means to said filter means;
(h) second mixer means having inputs coupled to simultaneously receive (1) input signals from said filter means and (2) mixing frequency signals of said second selectable frequency, for generating in response thereto, second mixer output signals in which said input signal is shifted in frequency such that the center frequency of the filtered frequency channel is shifted to a predetermined frequency;
(i) means for coupling said second mixer means to an antenna means for transmission of said second mixer output signals;
(j) reference frequency generator means for generating clocking signals of a single reference frequency; and
(k) mixing frequency generator means comprised of programmable counter means coupled to said reference frequency generator means for selectively generating said second selectable frequency to said first and second mixer means; wherein
(l) said first mixer means includes first and second mixer stages, said first mixer stage of said first mixer means being coupled to said mixing frequency generator means for mixing said first mixer input signals with said second selectable frequency and said second stage of said first mixer means being coupled to said reference frequency generator means for mixing the output signal from first stage with said reference frequency; and wherein (m) said second mixer means includes first and second mixer stages, said first mixer stage of said second mixer means being coupled to said mixing frequency generator means for mixing said second mixer input signals from said filter means with said second selectable frequency and said second stage of said second mixer means being coupled to said reference frequency generator means for mixing the output signal from said first stage with said reference frequency.

* * * * *